(12) United States Patent
Takagi et al.

(10) Patent No.: US 6,440,844 B1
(45) Date of Patent: *Aug. 27, 2002

(54) SEMICONDUCTOR DEVICE WITH COPPER WIRING AND ITS MANUFACTURE METHOD

(75) Inventors: Hideo Takagi; Kiyoshi Izumi; Wataru Futo; Satoshi Otsuka; Shigetaka Uji; Masataka Hoshino; Yukihiro Satoh; Koji Endo; Yuzuru Ohta; Nobuhiro Misawa, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/111,799

(22) Filed: Jul. 8, 1998

(30) Foreign Application Priority Data

Jul. 8, 1997 (JP) .............................................. 9-182559
Jul. 7, 1998 (JP) ........................................... 10-191804

(51) Int. Cl.[7] ........................................ H01L 21/4763
(52) U.S. Cl. ...................... 438/637; 438/687; 438/675; 257/763
(58) Field of Search ................................. 438/687, 692, 438/637, 624, 675; 257/762, 641, 650, 643, 763

(56) References Cited

U.S. PATENT DOCUMENTS

| 5,600,170 | A | * | 2/1997 | Sugiyama | 257/382 |
| 5,686,760 | A | * | 11/1997 | Miyakawa | 257/762 |
| 5,739,579 | A | * | 4/1998 | Chiang et al. | 257/762 |
| 5,759,906 | A | * | 6/1998 | Lou | 438/623 |
| 5,780,358 | A | * | 7/1998 | Zhou et al. | 438/645 |
| 5,880,018 | A | * | 3/1999 | Boeck et al. | 438/619 |
| 5,953,634 | A | * | 9/1999 | Kajita et al. | 438/687 |
| 5,989,983 | A | * | 11/1999 | Goo et al. | 438/473 |

FOREIGN PATENT DOCUMENTS

JP          6-291201         * 10/1994

* cited by examiner

*Primary Examiner*—Phat X. Cao
(74) *Attorney, Agent, or Firm*—Armstrong, Westerman and Hattori, LLP.

(57) ABSTRACT

The method of manufacturing a semiconductor device includes the steps of forming copper wiring; reducing an oxide film on the surface of the copper wiring by heating the copper wiring to a temperature in a range of 250° C.–450° C. under reductive gas or by treating the copper wiring in plasma of reductive gas; and then forming a film of a material not containing oxygen on the copper wiring without exposing the copper wiring to external atmosphere, and can provide a semiconductor device with good copper wiring.

21 Claims, 7 Drawing Sheets

SEMICONDUCTOR DEVICE WITH COPPER WIRING AND ITS MANUFACTURE METHOD

This application is based on Japanese patent applications No. HEI 9-182559 filed on Jul. 8, 1997 and No. HEI 10-191804 filed on Jul. 7, 1998, the entire contents of which are incorporated herein by reference.

BACKGROUND OF THE INVENTION a) Field of the Invention

The present invention relates to a semiconductor device and its manufacture method, and more specifically, to a semiconductor device with copper (Cu) wiring and its manufacture method.

b) Description of the Related Art

Semiconductor integrated circuit devices are required to have higher integration density and higher operation speed. Copper wiring is proposed as a solution for the above because resistivity of copper is smaller than that of aluminum. However, various problems occur when manufacturing a semiconductor integrated circuit device having the copper wiring.

More precisely, it is difficult to pattern the copper wiring, as desired, by the reactive ion etching applied onto a patterned resist film formed on the copper wiring layer. A proposed method without such patterning includes steps of forming a trench or groove in an insulating layer, filling (inlaying) the trench with copper, and removing bulged copper on the insulating layer by polishing or the like.

It is also proposed a method for forming a multi-layer wiring having connection holes which are filled with copper plugs. In this method, the connection holes are formed in an insulating layer provided between two copper wiring layers, and the copper plugs are formed by chemical vapor deposition (CVD) or electrolytic plating. After the connection holes are filled with copper, bulged copper is polished to be removed.

Conventional techniques for forming the copper wiring still have various problems. For example, preferable wiring should have the electro-migration resistance while having smaller resistivity, however, the copper wiring formed by the conventional method does not always have a high electro-migration resistance.

The copper wiring should be bonded strongly to adjacent layers, however, bond strength is not always enough. It is desired that an insulating layer has a large resistivity while the wiring has a low resistivity, however, the resistivity of the insulating layer formed by the conventional method is not always large enough.

The insulating layer formed on a wiring formed with buried copper is not always flat, however, a flat insulating layer is desired for forming a conductive layer thereon.

SUMMARY OF THE INVENTION

It is an object of the present invention to provide a method for manufacturing a semiconductor device having excellent copper wiring.

It is another object of the present invention to provide a semiconductor device having excellent copper wiring.

According to one aspect of the present invention, there is provided a semiconductor device comprising: a semiconductor substrate; a first insulating layer formed on said semiconductor substrate; a first trench having a bottom and sides formed in said first insulating layer from a surface thereof to a middle in a thickness of said first insulating layer; a first wiring layer including a main wiring layer buried in said trench, and substantially composed of copper; an interlayer insulating film covering said first wiring layer and said first insulating layer; a connection hole formed through said interlayer insulating film, and having a side surface formed of said interlayer insulating film, and a bottom surface formed of a surface of a connection region of said first wiring layer; a conductive plug filling said connection hole and including a buried conductor substantially composed of tungsten; a second insulating layer formed on said conductive plug and said interlayer insulating film; a second trench formed through said second insulating layer from a top surface to a bottom surface thereof, and having a bottom and a side, wherein a part of the bottom is a top surface of said conductive plug; and a second wiring layer filling said second trench and including a main wiring layer which is substantially composed of copper.

According to another aspect of the present invention, there is provided a method for manufacturing a semiconductor device comprising the steps of: forming a first insulating layer on a semiconductor substrate; forming a first trench in a top surface of said first insulating layer; forming a first wiring layer, filling said first trench, including a main wiring layer which consists essentially of copper; forming an interlayer insulating film on said first insulating layer while covering said first wiring layer; forming a connection hole through said interlayer insulating film to expose said first wiring layer; filling said connection hole with a conductive plug including a buried conductor which essentially consists of tungsten; and forming a second wiring layer connected to said conductive plug, including a main wiring layer which essentially consists of copper.

There is provided a wiring which has a high electro-migration resistance while its resistivity is low, by connecting multi-layer wirings of copper or copper alloy with conductive plug including a buried conductor of tungsten.

According to a further aspect of the present invention, there is provided a method of manufacturing a semiconductor device comprising the steps of: forming a copper wiring layer, filling a trench formed in an insulating layer; removing said copper wiring layer on said insulating film to leave a copper wiring only in said trench; forming an interlayer insulating film having planarizing function on said insulating film, covering said copper wiring; and forming another copper wiring on said interlayer insulating film having the planarizing function. Steps can be generated upon removing extra copper layer, however, those steps will be absorbed in the interlayer insulating layer having the planarizing function.

According to a further aspect of the present invention, there is provide a method for manufacturing a semiconductor device comprising the steps of: forming copper wiring; reducing an oxide film on a surface of said copper wiring by heating said copper wiring to a temperature in a range of 250° C. to 450° C. in a reductive gas or by treating in a plasma of a reductive gas; forming a film of a material not containing oxygen on said copper wiring without exposing said copper wiring to atmosphere.

The upper layer strongly sticks to the copper layer because the natural oxide film on the surface of the copper layer is removed.

Low via resistance between the upper and lower copper layers can be obtained. Moreover the wiring withstands electro-migration better. Other layers such as an insulating layer on the copper wiring are prevented from being peeled off.

DESCRIPTION OF THE PREFERRED EMBODIMENTS

Figure 1A:
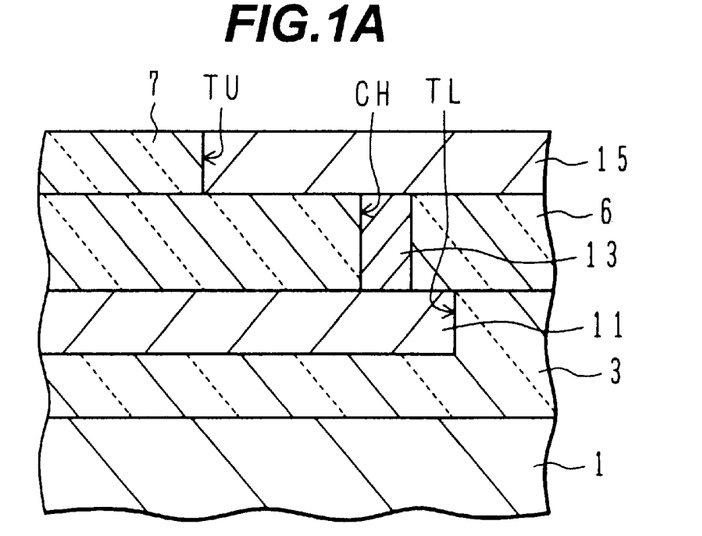
FIGS. 1A to 1G are cross sectional views schematically showing the structure of a semiconductor device according to an embodiment of the present invention.

FIG. 1A is a cross sectional view showing a basic embodiment of the present invention. A semiconductor substrate 1 is, for example, a silicon substrate, in a surface of which a CMOS circuit is formed. An insulating layer 3 is formed on the semiconductor substrate 1. A trench or groove TL is formed in part of the insulating layer 3 for accomodating a lower copper wiring 11. The lower copper wiring fills the trench TL in the insulating layer 3 and forms a substantially coplanar surface with the surface of the insulating layer 3. Another insulating layer 6 is formed to cover the copper wiring 11 and the insulating layer 3. A connection hole CH is formed through the insulating layer 6. The connection hole CH is filled with a tungsten plug 13. Tungsten is a refractory metal, i.e. a metal having a high melting point. Another insulating layer 7 is formed to cover the plug 13 and the insulating layer 6. A trench or groove TU is formed through a part of the insulating layer 7 to expose the surface of the plug 13. An upper copper wiring 15 is formed to fill the trench TU.

Thus, the wiring structure shown in FIG. 1A comprises a plurality of wiring layers made of copper layers and a tungsten plug or plugs connecting these wiring layers. The copper wiring layers are formed by sputtering and have a high purity. Thus, the copper wiring layers have a high resistance against the electro-migration.

However, the copper wiring layer formed by sputtering does not have enough coverage for filling the connection hole. Formation of the copper layer by CVD with good coverage allows to form a plug which fills the connection hole. The purity of the copper layer, however, is degraded and the resistance to the electro-migration is degraded. Thus, the plug for interlayer connection is formed of tungsten which is a refractory metal. Such a tungsten plug is formed, for example, by CVD using $WF_6$ as the W source. According to this structure, a three-dimensional or multi-layer wiring, which satisfies a high current density of $8 \times 10^5$ A/cm$^2$, can be formed.

Figure 1B:
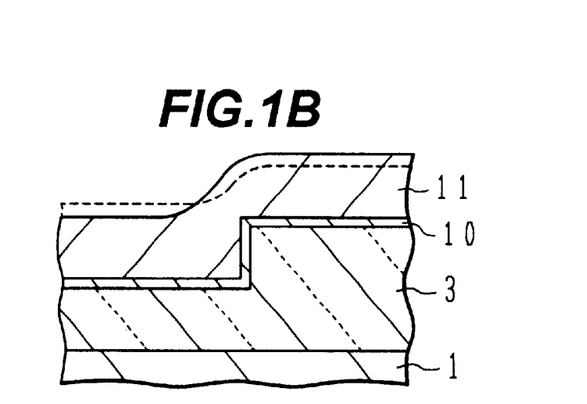

Direct deposition of copper wiring layers onto insulating layers of $SiO_2$ or the like, upon forming the copper wiring layers 11 and 15, may cause solid state diffusion of copper from the copper layers into the insulating layers. The diffused copper deteriorates the insulating characteristics of the insulating layers, to form a cause of leak current. To prevent diffusion of copper, a barrier metal layer 10 is preferably formed first on the surface of the insulating layer 3, and then a copper wiring layer 11 is formed thereon, as shown in FIG. 1B.

Refractory metal nitride, such as TiN, TaN, WN or TiSiN, or refractory metal compound, such as TiSi or TiW may be used for the barrier metal layer 10. In this specification, those materials are collectively referred to as refractory metal compound or compounds.

It is preferable, after depositing the copper layer 11, to raise the substrate temperature to reflow the deposited copper layer 11. Reflow treatment enables to steadily fill the trench in the insulating layer with the copper layer.

Figure 1C:
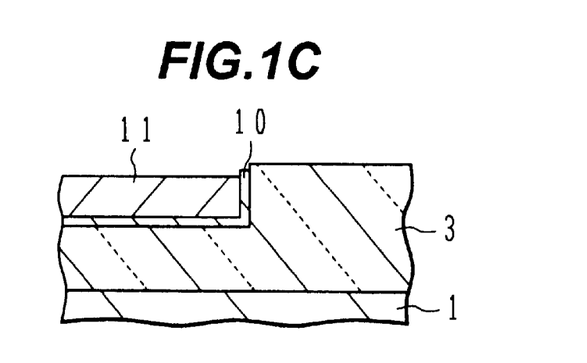

As shown in FIG. 1C, unnecessary or extra portions of the copper layer 11 and the barrier metal layer 10 on the insulating layer 3 are removed. For example, copper layer 11 and the barrier metal layer 10 on the insulating layer 3 can be removed by chemical-mechanical polishing (CMP).

In the structure of FIG. 1A, the plug 13 of tungsten, which is a refractory metal, is formed in the connection hole. CVD with a source gas of $WF_6$ is a preferred method for forming the tungsten plug. In this case, if $WF_6$ reacts with the surface of the lower copper wiring, tungsten (W) diffuses into the copper wiring 11, to increase the resistance of the copper wiring.

Figure 1D:
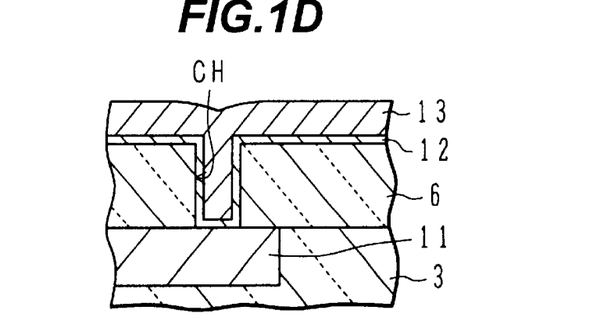
Figure 1E:
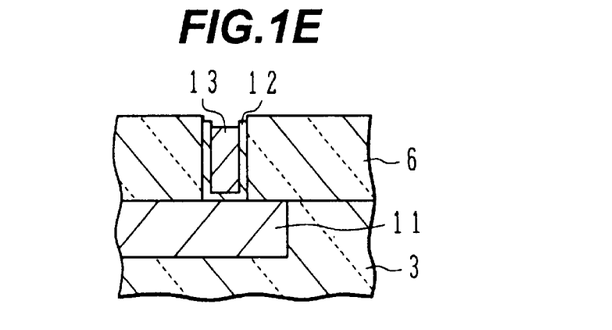

As shown in FIG. 1D, after the connection hole CH is formed, preferably a titanium nitride film 12 having an enough thickness and an enough density is formed, and a blanket film 13 of tungsten is formed thereon. A film of other refractory metal nitride, such as TaN and WN, may also be used instead of a titanium nitride film. Here, the stoichiometry of the nitride may not be strict or rigorous. Thereafter, as shown in FIG. 1E, the tungsten blanket film 13 and the titanium nitride film 12 on the surface of the insulating layer 6 are removed by chemical mechanical polishing. In this way, contact between a plug and a lower copper wiring, which has a high resistance to electro-migration and a low electric resistance, can be provided.

Figure 1F:
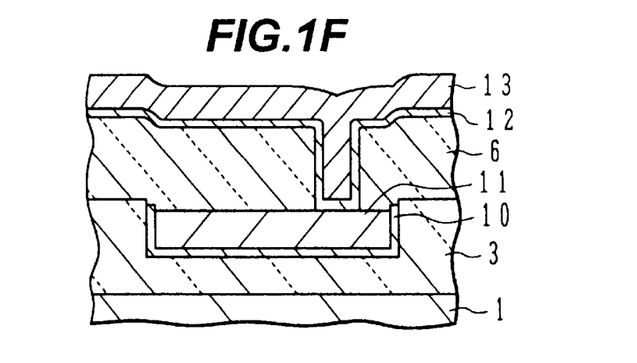

Polishing, such as chemical-mechanical polishing, when employed in the formation of the lower copper wiring layer 11 may make a bump or step between the surface of the lower copper wiring 11 and the surface of the insulating layer 3, as shown in FIG. 1C. This occurs because the rates of the polishing of the insulating layer 3, the copper layer 11 and the barrier metal layer 10 are different. This phenomenon remarkably occurs particularly in the case where the barrier metal layer 10 is formed under the copper layer. In such a case, if the insulating layer 6 is simply formed thereon, the insulating layer 6 will also have a bump or step in the surface, as shown in FIG. 1F. When a titanium nitride film 12 and a tungsten film 13 are formed thereafter, a bumped or stepped conductive layer will be formed. In this case, it becomes difficult to completely remove the lower titanium nitride film and the upper tungsten film extending on the lower surface of the step, even by chemical mechanical polishing. Incomplete removing may cause short-circuit and the like.

Figure 1G:
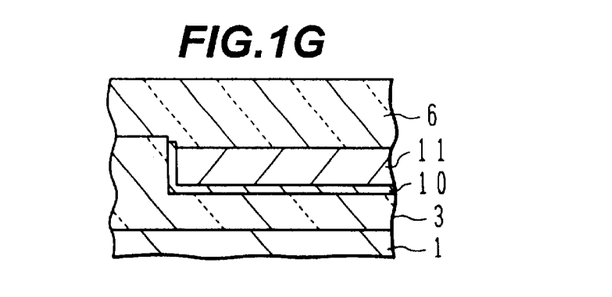

Thus, after forming the lower copper wiring, it is preferable to form an insulating layer 6 having planarizing function to form a planarized or flat surface, as shown in FIG. 1G. Then, a connection hole CH is formed through the insulating layer 6 having a planarized surface. The conductive plug and the upper wiring layer are formed thereon. In this case, the material of the conductive plug is not limited to tungsten. For example, a copper plug may be formed via a barrier metal layer.

Although description is made on a case wherein a single insulating layer 6 having planarizing function is formed, it is possible to combine insulating layers with and without planarizing function, or to combine a plurality of insulating layers each having planarizing function.

An organic or inorganic spin-on glass (SOG) film may be used as the insulating layer having planarizing function. A hydrogen silsesquioxane (HSQ) resin film may also be used. Those films may be collectively referred to as a liquefied insulating film or films.

FIGS. 2A to 4J are cross sectional views for explaining a method for manufacturing a semiconductor device having multi-layer wiring according to an embodiment of the present invention.

Figure 2A:
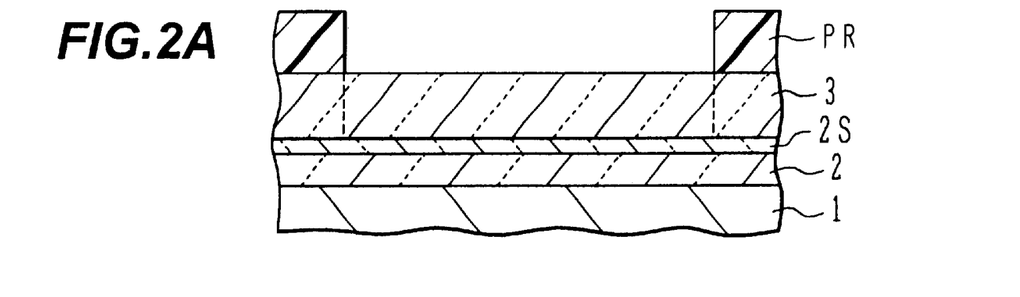
FIGS. 2A to 2D, 3E to 3G and 4H to 4J are cross sectional views for explaining manufacturing steps of the semiconductor device according to an embodiment of the present invention.

As shown in FIG. 2A, on a surface of a silicon (Si) substrate 1 in which semiconductor elements such as MOS transistors or the like are formed, a low temperature oxide layer (LTO) having a thickness of about 500 nm is formed by plasma enhanced CVD, as an interlayer insulating layer 2.

The LTO means silicon oxide formed at a low temperature. The LTO includes a silicon oxide layer made by ordinary plasma enhanced CVD and fluorine doped (F-doped) silicate glass (FSG). The dielectric constant of the FSG is low. For example, the dielectric constant of approximately 4.0 reduces down to approximately 3.5 by doping around 6–7 w % of fluorine. Such an insulating material having a low dielectric constant is effective for reducing parasitic capacitance of the wiring.

Then, plasma CVD is performed to form a silicon nitride layer 2S having a thickness of approximately 50 nm. This silicon nitride layer works as an etching stopper during etching for forming a trench for the next wiring. An LTO layer 3 having a thickness of 350 nm is deposited on the silicon nitride layer 2S by plasma CVD. This LTO layer 3 constitutes intralayer insulating films between wirings in the same wiring level.

The intralayer insulating layer 3 may contain a layer or layers of low-dielectric-constant material such as FSG (F-doped silicate glass) or HSQ (hydrogen silsesquioxane) resin.

A resist layer PR is coated on the insulating layer 3, exposed, and developed, to form a resist pattern having an aperture at the portion of a trench, in order to form a trench for wiring in the intralayer insulating layer 3. The LTO film 3 is-etched using this resist pattern as a mask by reactive ion etching (RIE) using a mixed gas of $C_4F_8$, CO and Ar. The etching is stopped at the surface of the underlying silicon nitride layer 2S. Thereafter, the resist pattern PR is removed.

Figure 2B:
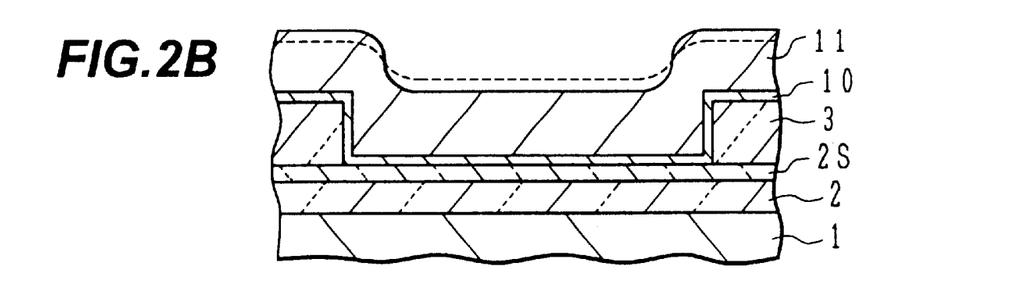

As shown in FIG. 2B, the semiconductor substrate is loaded in a vacuum chamber of a sputtering apparatus, and a TiN film 10 having a thickness of about 50 nm is deposited on the substrate by sputtering. This TiN layer serves as a barrier metal layer for preventing copper from diffusing into the interlayer insulating film when a copper layer is formed. The barrier metal layer may be formed of other refractory metal nitrides, instead of a TiN layer, such as a TaN layer, a WN layer, and a TiSiN layer, or refractory metal compounds such as TiSi and TiW. The TiN layer may also be deposited by metal organic chemical vapor deposition (MOCVD), instead of sputtering.

Following the formation of the TiN layer 10, a copper layer 11 having a thickness of about 0.7 μm is deposited by sputtering, without breaking the vacuum condition. The degree of vacuum (background pressure) of this process is about $9 \times 10^{-8}$ Torr. The sputtering conditions are as follows:

Ar gas pressure: 2 mTorr,
DC electric power: 12 kW,
target/substrate distance: 150 mm,
substrate temperature: 150° C., and
deposition rate: 1.25 μm/min.

After the deposition of the copper layer, hydrogen gas is introduced, and the copper layer 11 is reflowed by annealing the substrate at a temperature of 390° C. for 5 minutes in an atmosphere of hydrogen ($H_2$) 100%, and pressure 100 mTorr. Here, the reflow step can be performed at a temperature of 300° C.–450° C.

After the reflow step, the semiconductor substrate is taken out of the vacuum chamber. The barrier metal layer 10 and the copper layer 11 on the upper surface of the intralayer insulating film 3 are removed by chemical mechanical polishing (CMP). In this way, a copper wiring (trench wiring) embedded in a trench or groove in the intralayer insulating layer 3 is formed.

Figure 2C:
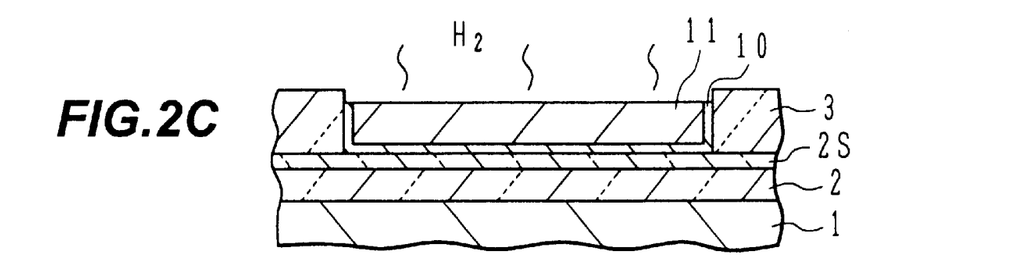

FIG. 2C shows a cross sectional structure of the semiconductor substrate after the CMP. The copper layer 11 and the barrier metal layer 10 remain only in the trench, by CMP, and form a surface recessed from the surface of the intralayer insulating film 3. Copper is a metal which is extremely easily oxidized. When a copper layer is subjected to a CMP treatment, it is inevitable that a native oxide film is formed on the surface thereof.

Next, the semiconductor substrate is loaded in a vacuum chamber, and subjected to a treatment for removing the native oxide film in a reducing atmosphere. For example, the substrate is annealed at a temperature of 250° C.–350° C. for 2 minutes in an atmosphere of hydrogen 100% and pressure 20–80 mTorr, to reduce the native oxide film on the surface of the copper wiring 11. Once formed native oxide film can be removed by the reducing treatment. Here, the reducing treatment may be done by other methods. For example, ammonia atmosphere may be used in place of the hydrogen atmosphere. The annealing temperature can be selected from a range of 250° C.–450° C. In place of heating, or with heating, plasma treatment may be done.

Figure 2D:
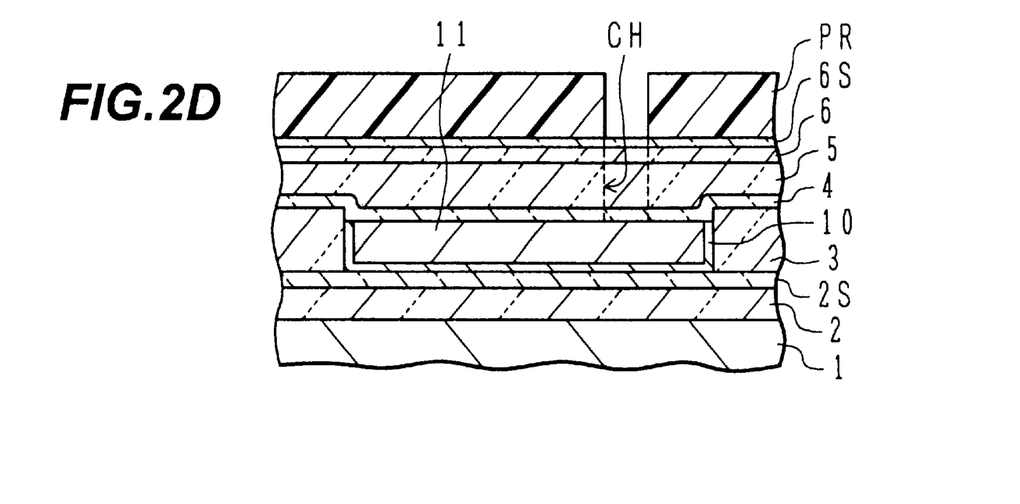

As shown in FIG. 2D, after having reduced the native oxide film on the surface of the copper wiring, a silicon nitride film 4 having a thickness of about 50 nm is deposited on the surface of the copper wiring and the interlayer insulating film by plasma enhanced CVD without breaking the vacuum, as a barrier layer for preventing diffusion from the copper layer 11 into the oxide film. The barrier layer is an insulating layer containing no oxygen, such as a nitride film or a carbon film.

Next, an HSQ film 5 is coated to a thickness of about 400 nm, and then cured (hardened) at 400° C. for 30 minutes. The HSQ film 5 is coated to have a flat surface, and cured to form an insulating layer of a low dielectric constant. Then, an FSG film 6 having a thickness of about 300 nm is deposited by plasma enhanced CVD. Further, on the surface of the FSG film 6, a silicon nitride film 6S having a thickness of about 50 nm is deposited by plasma enhanced CVD. This silicon nitride film serves as an etching stopper when a trench for the upper wiring layer is formed.

A resist film PR is coated on the surface of the silicon nitride film 6S, exposed and developed to form a resist pattern for forming a connection hole. For example, a resist pattern having an aperture of a diameter 0.3 μmφ is formed.

A connection hole CH reaching the lower copper layer 11 is formed by etching the SiN film 6S, the FSG layer 6, the HSQ layer 5, and the SiN layer 4 using this resist pattern as a mask. Then, the resist pattern is removed by remover or ashing. Upon this step of removing the resist pattern, the copper surface exposed in the connection hole CH is oxidized to form a native oxide film.

Figure 3E:
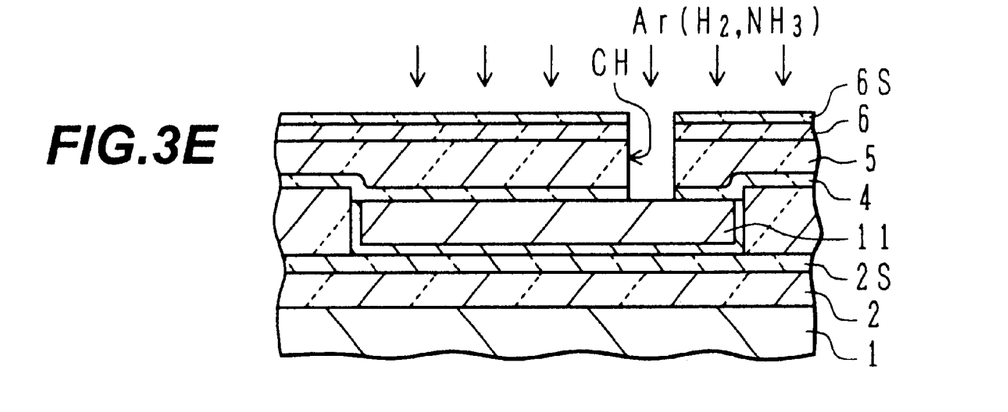

As shown in FIG. 3E, after exposing the lower copper wiring 11 in the connection hole CH, the semiconductor substrate is loaded in a vacuum chamber, and the native oxide film in the connection hole CH is removed by introducing Ar gas, and forming plasma of the Ar gas, to perform argon sputtering.

Here, Ar sputtering removes the native oxide film on the surface of copper layer, but also simultaneously sputters the copper itself. Sputtered copper may be resputtered on the side surface of the connection hole to degrade the insulating property of the insulating layer. Then, it is preferable to conduct reducing treatment using hydrogen atmosphere, or ammonia atmosphere, in place of Ar sputtering.

For example, the native oxide film on the exposed copper wiring 11 is reduced by annealing at a temperature of 250–350° C. for 2 minutes in an atmosphere of hydrogen 100% and pressure 20–80 mTorr.

Figure 3F:
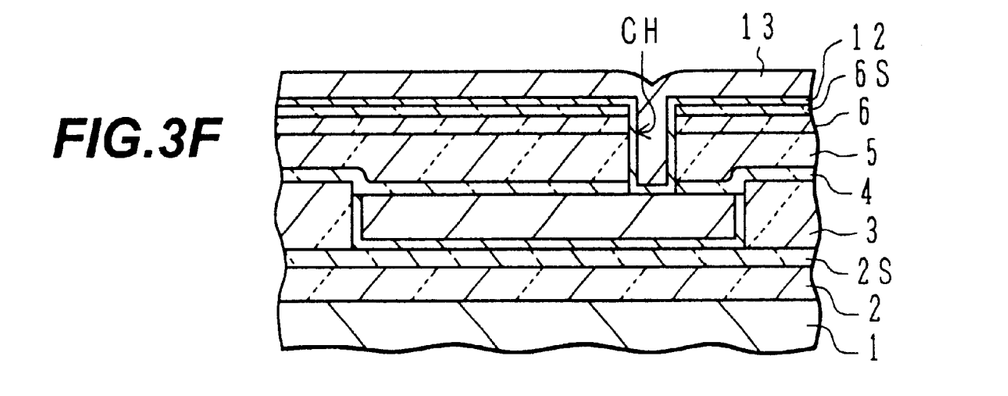

As shown in FIG. 3F, after reducing the native oxide film on the copper wiring 11, without breaking the vacuum, a TiN film 12 having a thickness of about 50 nm is deposited by long throw sputtering. The long throw sputtering is a method wherein the distance between a wafer and a target is set 300 mm or more to increase the vertical component of the scattered sputtering particles to form a film of a high density. In this way, the high density TiN film 12 thus formed effectively functions as a barrier layer between $Wf_6$ for depositing a W layer thereafter and the lower copper wiring 11.

The TiN layer 12 formed by the above-mentioned long throw sputtering has a wider (200) orientation area than (111) orientation area, wherein the ratio (200)/(111) is larger than 1.0 and at most 3.0.

When a TiN layer is formed by simply forming a connection hole and performing usual sputtering, the (111) orientation becomes dominant. Compared with this case, the formation of the TiN layer as described above mixes (200) orientation in (111) orientation, and makes the area of the (200) orientation wider than that of the (111) orientation. It is considered that such a structure increases the density of the TiN layer, and reduces the resistance.

Thereafter, a tungsten layer 13 is deposited in blanket fashion to have a thickness of about 300 nm by CVD which reduces $Wf_6$ gas. The deposition of this W layer is done with good step coverage, and enables to embed the connection hole appropriately even when the connection hole CH is narrow and deep.

Figure 3G:
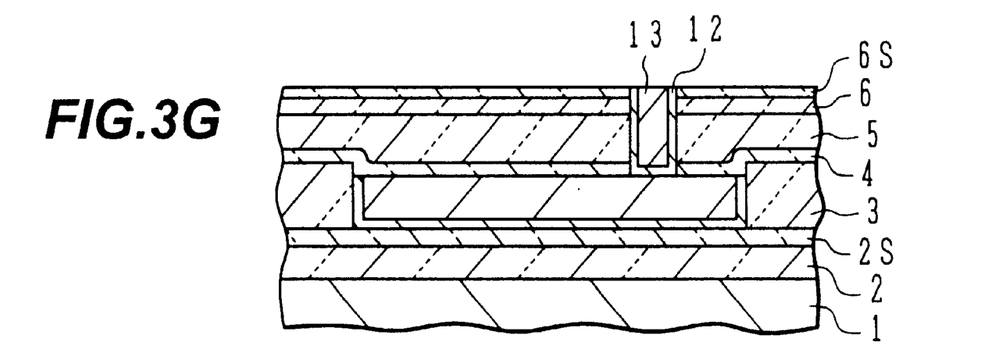

As shown in FIG. 3G, the tungsten layer 13 and the TiN layer 12 are polished by CMP to leave a conductive plug formed of the TiN layer 12 and the tungsten layer 13 in the connection hole CH.

Figure 4H:
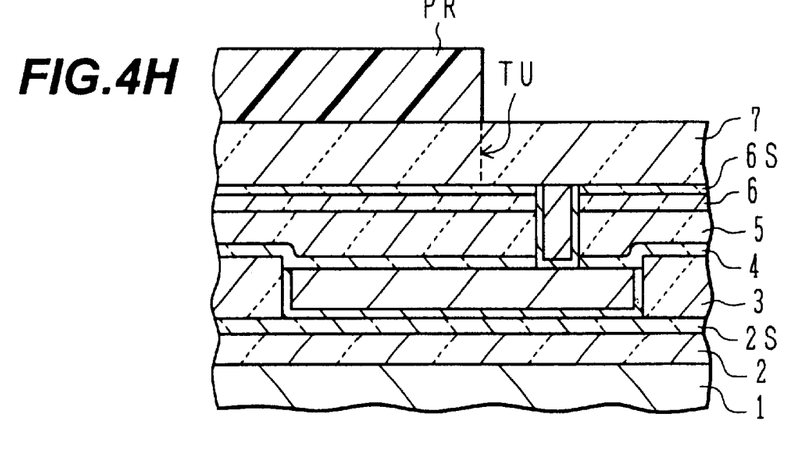

As shown in FIG. 4H, a low temperature silicon oxide (LTO) film 7 is formed on the surface of the substrate formed with the conductive plug. Further, a photoresist layer is formed on the LTO film 7, and is exposed and developed to form a resist pattern PR. This resist pattern PR has an aperture of a shape corresponding to the upper copper wiring. The LTO film 7 is etched by RIE using the resist pattern PR as a mask, to form a trench TU for forming a copper wiring. Then, the resist pattern PR is removed.

Here, the LTO film 7 may be arranged to have a structure containing an FSG layer or an HSQ layer, similar to the intralayer insulating film 3.

Figure 4I:
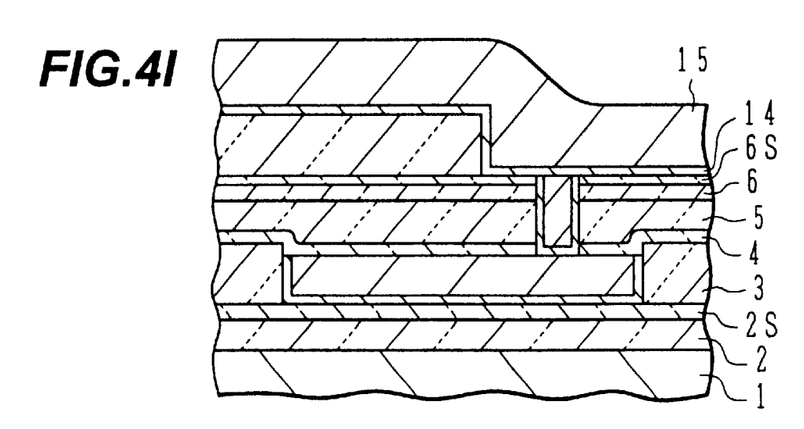

As shown in FIG. 4I, a TiN barrier metal layer 14 for preventing copper diffusion is formed and a copper layer 15 is formed thereon, similar to the case of forming the lower copper wiring.

Figure 4J:
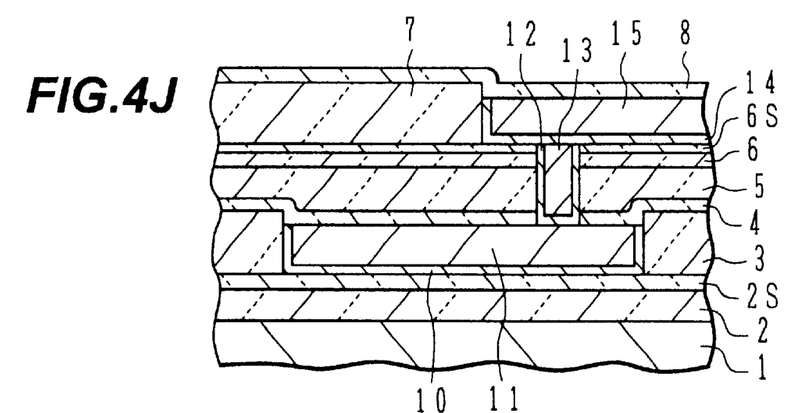

As shown in FIG. 4J, the TiN layer 14 and the W layer 15 on the LTO film 7 are polished by CMP, to leave an upper copper wiring 15 in the trench TU.

The native oxide film on the surface of the upper copper wiring is annealed in an atmosphere of hydrogen 100% and pressure 20–80 mTorr at a temperature of 250–350° C. for 2 minutes, according to necessity, to reduce the native oxide film. Then, keeping the vacuum atmosphere, a silicon nitride film 8 having a thickness of about 1.0 μm is deposited by plasma enhanced CVD on the surface of the copper wiring. The silicon nitride film 8 functions as a cover film.

By the above steps, a multi-layer wiring structure is obtained wherein the upper and lower embedded copper wirings are connected by a tungsten plug.

Figure 5:
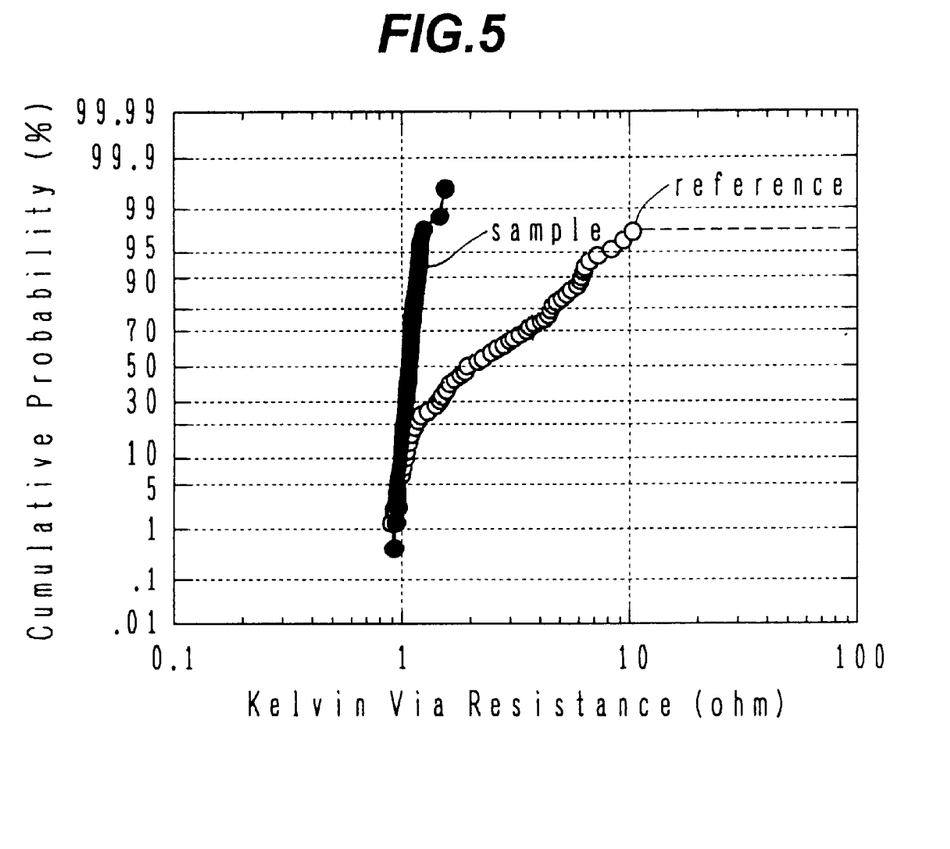
FIG. 5 is a graph indicating via resistance of samples manufactured in accordance with the embodiment of the present invention.

FIG. 5 shows the contact resistance of the connection between the upper and lower copper wirings connected with the tungsten plug formed according to the above-mentioned method. Here, the removal of the native oxide film in the connection hole was done by Ar sputtering. In the figure, the abscissa represents the contact resistance in the connection hole measured by Kelvin method in the unit of $\Omega$, and the ordinate represents the cumulative probability in the unit of percent. Here, the diameter of the via hole used for measurement is 0.44 μm. As is apparent from the figure, the contact resistance is of the order of above 1$\Omega$, and variation is small.

For reference, another contact resistance is also shown, for a case wherein a TiN film is formed simply by the usual sputtering, in place of the long throw sputtering, and a W film is formed thereon by CVD. In this case, the range wherein the contact resistance is kept at the order of about 1$\Omega$ is at most up to about 30%, and most of the remaining part distribute in the range up to around 10$\Omega$. Further, the remaining sample of little more than 1% showed farther larger contact resistance. Compared with the reference examples, it is found that the contact resistance in the connection hole is low and is kept at a constant value according to the above embodiment.

Figure 6:
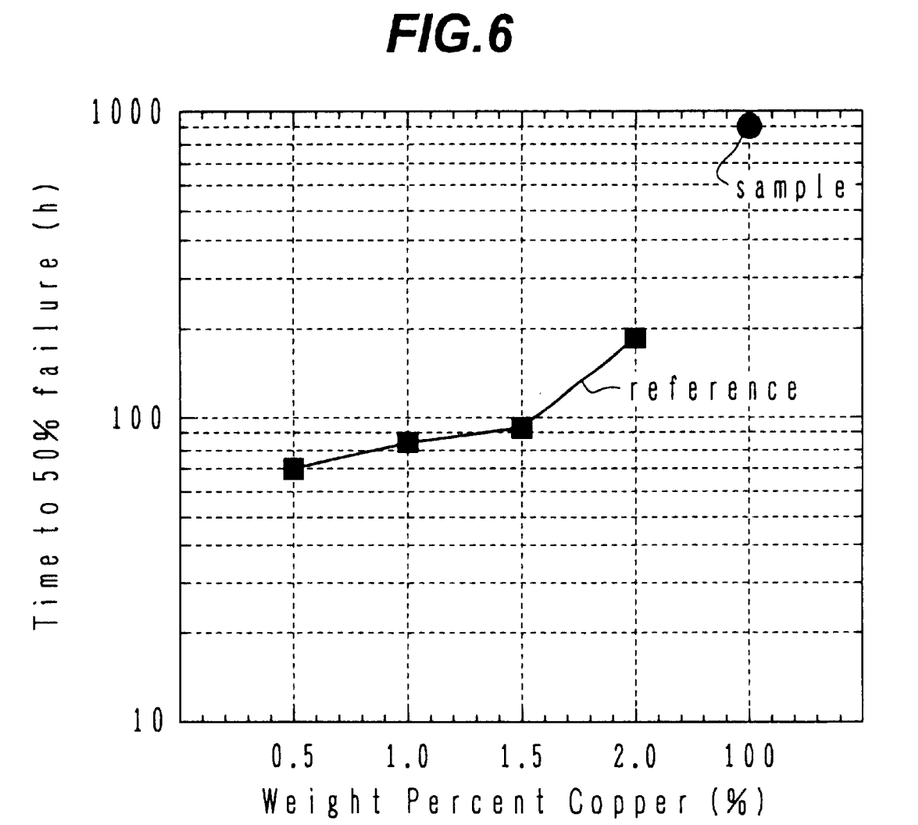
FIG. 6 is a graph indicating resistance against electro-migration of the samples manufactured in accordance with the embodiment of the present invention.

FIG. 6 shows the characteristics of electomigration of the multi-layer wiring structure according to the above embodiment, wherein the upper and the lower copper wiring are connected with the tungsten plug. The test for electromigration was done under the conditions of 200° C. and a current density of 2–3 $MA/cm^2$. The time at which 50% failure occurs under these conditions was measured. Here, the abscissa represents Cu composition in Al in the unit of percent, for the purpose of comparison with the conventional Al alloy wiring. In the case of the conventional Al alloy having a copper composition of 0.5–2.0 w %, the time at which failure reaches 50% is 200 hours or less. In the case of wiring of copper 100%, the time at which failure reaches 50% was 800 hours or more.

As is apparent from this result, the copper wiring according to this embodiment has a long lifetime, which is longer than that of the conventional Al—Cu alloy wiring by about one digit.

In the above embodiment, reduction treatment on the surface of the copper layer was done, by treating the copper layer in hydrogen atmosphere, at 250–350° C., for 2 minutes. In place of the treatment in hydrogen atmosphere, treatment can be done in ammonia atmosphere.

For example, the surface of the copper layer can be processed in $NH_3$ atmosphere, at a pressure 0.1–10 Torr, at a temperature of 250° C.–400° C., for 10 seconds-180 seconds and in a plasma supplied with RF power of 20 W–300 W.

Then, keeping the vacuum atmosphere, an SiN layer having a thickness of about 50 nm is deposited by plasma enhanced CVD, as an insulating layer, on the copper layer. This SiN layer prevents diffusion of copper from the copper wiring layer into the oxide film.

The following experiments were done to prove the effect of the reducing treatment on the surface of the copper layer. Samples were formed by forming an oxide film having a thickness of about 100 nm on the surface of an Si substrate, forming a TiN layer having a thickness of 50 nm thereon by sputtering, and forming a Cu layer having a thickness of about 0.7 μm thereon by sputtering. After polishing the Cu layer by CMP to leave a thickness of about 500 nm, plasma treatment was done in $NH_3$ atmosphere, at a pressure of 1.6 Torr, at a temperature of 300° C., and with an RF power of 50 W, for 30 seconds. After this plasma treatment, without breaking the vacuum, an SiN layer was deposited on the surface of the copper layer to a thickness of 50 nm by plasma enhanced CVD. The gas used for plasma enhanced CVD was $SiH_4+NH_3+N_2$ (carrier).

For reference, other samples were also made which were not subjected to treatment in $NH_3$ plasma. Pull test was performed on the samples of these two kinds.

Samples subjected to the treatment in $NH_3$ plasma showed no peel at the SiN/Cu interface even at the pull test with a weight of 780 Kg/cm$^2$. The adhesive peeled off first.

Samples which were not subjected to treatment in $NH_3$ showed peel at the SiN/Cu interface at weights less than 700 Kg/cm$^2$.

From these results, it is seen that in the samples subjected to reduction of the native oxide film at the surface of copper has remarkably increased the adhesion between the copper layer and the protective layer formed thereon.

Although this invention has been described along the embodiments herein above, the invention is not limited thereto. Although description has been made on the case of forming a wiring layer with copper, additives such as Mg and Sn may be added to copper by a small amount. These additives improves the electromigration resistance, the surface stability, etc., but do not change the nature of the copper wiring in essential meaning. It would be apparent to those skilled in the art that various other changes, improvements, and combination are possible.

What are claimed are:

1. A method for manufacturing a semiconductor device comprising the steps of:

forming a first insulating layer on a semiconductor substrate;

forming a first trench in a surface of said first insulating layer;

forming a first wiring layer, including a main wiring layer essentially consisting of copper, in said first trench, the first wiring layer having a top surface recessed from that of said first insulating layer;

forming an interlayer insulating film on said first insulating layer, covering said first wiring layer, said interlayer insulating film having planarizing function for forming a substantially planar surface on a stepped surface;

forming a connection hole through said interlayer insulating film, exposing said first wiring layer;

filling said connection hole with a conductive plug including a buried conductor essentially consisting of tungsten; and forming a second wiring layer connected to said conductive plug, the second wiring layer including a main wiring layer essentially consisting of copper, wherein each of said steps of forming said first wiring layer and said second wiring layer includes sputtering a barrier layer made of at least one material selected from the group consisting of TiN, TaN, WN, TiSiN, TiSi and TiW, and sputtering a copper or copper alloy on the barrier layer.

2. The method for manufacturing a semiconductor device according to claim 1, wherein said step of forming the first wiring layer includes the sub-steps of:

forming in said first trench a film of refractory metal compound as barrier metal; and forming a main wiring layer essentially consisting of copper on said film of refractory metal compound.

3. The method for manufacturing a semiconductor device according to claim 1, wherein said step of forming the first wiring layer includes the sub-steps of:

forming a copper layer by sputtering to a thickness larger than a depth of said first trench;

heating said copper layer to a temperature in a range of 300–450° C. to reflow the copper layer; and polishing said reflowed copper layer to form copper wiring in said first trench.

4. The method for manufacturing a semiconductor device according to claim 1, wherein said step of filling the conductive plug includes the sub-steps of:

forming a refractory metal film containing nitrogen, covering said connection hole;

then, forming a tungsten film, filling said connection hole; and then, removing said refractory metal film containing nitrogen and said tungsten film on the interlayer insulating film by polishing.

5. The method for manufacturing the semiconductor device according to claim 4, wherein said sub-step of forming said refractory metal film containing nitrogen includes a step of forming such a TiN film by long-throw sputtering, that said TiN film has co-existing (200) surface and (111) surface, and an area of the (200) surface is larger than that of the (111) surface.

6. The method for manufacturing a semiconductor device according to claim 1, wherein said step of forming an interlayer insulating film includes the sub-steps of:

subjecting a surface of said main wiring layer essentially consisting of copper of said first wiring layer, to treatment in reductive atmosphere; and forming a silicon nitride film on the treated surface of the main wiring layer without breaking a vacuum.

7. The method of claim 1, further comprising the steps of:

forming a second insulating layer on said interlayer insulating film, covering said conductive plug; and forming a second trench in said second insulating layer, exposing said conductive plug, wherein said step of forming a second wiring layer fills said second trench with the second wiring layer.

8. The method of claim 7, wherein said step of forming the second wiring layer includes the sub-steps of:

forming in said second trench a film of refractory metal compound as barrier metal; and forming a second main wiring layer essentially consisting of copper on said film of refractory metal compound.

9. The method of claim 7, wherein said step of forming the second wiring layer includes the sub-steps of:

forming a copper layer by sputtering to a thickness larger than a depth of said second trench;

heating said copper layer to a temperature in a range of 300° C.–450° C. to reflow the copper layer; and polishing said reflowed copper layer to form copper wiring in said second trench.

10. The method for manufacturing a semiconductor device according to claim 1, wherein said interlayer insulating film is a liquefied insulating film.

11. A method for manufacturing a semiconductor device comprising the steps of:

forming a copper wiring layer, embedding a trench formed in an insulating film;

removing said copper wiring layer on said insulating film to leave a copper wiring only in said trench, the copper wiring layer having a top surface recessed from that of the insulating film;

forming an interlayer insulating film having planarizing function on said insulating film, covering said copper wiring wherein said planarizing function forms a substantially planar surface on a stepped surface; and forming another copper wiring layer on said interlayer insulating film having planarizing function, wherein each of said steps of forming said copper wiring layer and said another copper wiring layer includes sputtering a barrier layer made of at least one material selected from the group consisting of TiN, TaN, WN, TiSiN, TiSi and TiW, and sputtering a copper or copper alloy on the barrier layer, wherein said step of forming an interlayer insulating film includes the sub-steps of:

applying a liquefied insulating film; and depositing a silicon oxide film having a low dielectric constant.

12. The method for manufacturing a semiconductor device according to claim 11, wherein said step of forming another copper wiring includes the sub-steps of:

forming an upper insulating film on said interlayer insulating film;

forming a trench through said upper insulating film;

forming a copper layer, filling said trench in said upper insulating film; and removing said copper layer on said upper insulating film.

13. A method for manufacturing a semiconductor device comprising the steps of:

forming a copper wiring in a trench of an insulation film, the copper wiring having a top surface recessed from that of the insulation film;

reducing an oxide film on a surface of said copper wiring by heating said copper wiring to a temperature in a range of 250° C.–450° C. in reductive gas or by treating said copper wiring in plasma of reductive gas;

forming a film of a material not containing oxygen on said copper wiring without exposing said copper wiring to external atmosphere, and forming an interlayer insulating film having planarizing function on said insulating film, covering said copper wiring, wherein said planarizing function forms a substantially planar surface on a stepped surface;

wherein the step of forming a copper wiring includes the steps of forming a barrier layer made of at least one material selected from the group consisting of TiN, TaN, WN, TiSiN, TiSi of and TiW, and forming a copper or copper alloy on the barrier layer by sputtering.

14. The method for manufacturing a semiconductor device according to claim 13, wherein said reductive gas is a gas including hydrogen or ammonia.

15. The method for manufacturing a semiconductor device according to claim 13, wherein said film of a material not containing oxygen is a nitride film or a carbon film.

16. The method for manufacturing a semiconductor device according to claim 13, wherein said interlayer insulating film is a liquefied insulating film.

17. A method for manufacturing a semiconductor device comprising the steps of:

forming an interlayer insulating film having planarizing function on an insulating film, covering a copper wiring, wherein said copper wiring has a top surface recessed from that of the insulating film, and said planarizing function forms a substantially planar surface on a stepped surface;

forming a connection hole in said insulating film formed on said copper wiring;

reducing an oxide film on a surface of said copper wiring by heating said copper wiring to a temperature in a range of 250° C.–450° C. under reductive gas or by treating said copper wiring in plasma of reductive gas;

then, depositing a metal layer for connection on said copper wiring without exposing said copper wiring to external atmosphere;

sputtering a barrier layer made of at least one material selected from the group consisting of TiN, TaN, WN, TiSiN, TiSi and TiW; and sputtering a copper or copper alloy on the barrier layer.

18. The method for manufacturing a semiconductor device according to claim 17, wherein said interlayer insulating film is a liquefied insulating film.

19. A method for manufacturing a semiconductor device comprising the steps of:

forming an interlayer insulating film having planarizing function on an insulating film, covering a copper wiring, wherein said copper wiring has a top surface recessed from that of the insulating film, and said planarizing function forms a substantially planar surface on a stepped surface;

forming a connection hole in the interlayer insulating film formed on the copper wiring;

reducing an oxide film on a surface of said copper wiring by heating said copper wiring to a temperature in a range from 250° C. to 450° C. under reductive gas or by treating said copper wiring in plasma of reductive gas; and then, depositing a metal layer, to fill the connection hole on said copper wiring.

20. The method for manufacturing a semiconductor device according to claim 19, wherein said interlayer insulating film is a liquefied insulating film.

21. A method of manufacturing a semiconductor device comprising the steps of:

forming a copper wiring layer, embedding a trench formed in an insulating film;

removing said copper wiring layer on said insulating film to leave a copper wiring only in said trench, the copper wiring layer having a top surface recessed from that of the insulating film;

forming an interlayer insulating film having a planarizing function on said insulating film, covering said copper wiring wherein said planarizing function forms a substantially planar surface on a stepped surface; and forming another copper wiring layer on said interlayer insulating film having a planarizing function, wherein each of said steps of forming said copper wiring layer and said another copper wiring layer includes sputtering a barrier layer made of at least one material selected from the group consisting of TiN, TaN, WN, TiSiN, TiSi and TiW, and sputtering a copper or copper alloy on the barrier layer, wherein said interlayer insulating film is a liquefied insulating film.

* * * * *